United States Patent
Lim et al.

(10) Patent No.: US 10,856,454 B2
(45) Date of Patent: Dec. 1, 2020

(54) ELECTROMAGNETIC INTERFERENCE (EMI) SHIELD FOR CIRCUIT CARD ASSEMBLY (CCA)

(71) Applicant: Intel Corporation, Santa Clara, CA (US)

(72) Inventors: Min Suet Lim, Gelugor (MY); Yew San Lim, Gelugor (MY); Jia Yan Go, Kulim (MY); Tin Poay Chuah, Bayan Lepas (MY); Eng Huat Goh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/535,766

(22) Filed: Aug. 8, 2019

(65) Prior Publication Data

US 2019/0364702 A1    Nov. 28, 2019

(51) Int. Cl.
*H05K 9/00* (2006.01)
*H05K 3/46* (2006.01)
*H05K 1/11* (2006.01)

(52) U.S. Cl.
CPC ............ *H05K 9/0022* (2013.01); *H05K 1/11* (2013.01); *H05K 3/4644* (2013.01); *H05K 9/0028* (2013.01)

(58) Field of Classification Search
CPC ........................ H05K 9/0022; H05K 9/0028
See application file for complete search history.

(56) References Cited

U.S. PATENT DOCUMENTS

| 5,637,834 | A | * | 6/1997 | La Bate, Jr. | ......... | H05K 3/4617 |
| | | | | | | 174/262 |
| 6,297,967 | B1 | * | 10/2001 | Davidson | ............. | H05K 9/0028 |
| | | | | | | 174/377 |
| 9,865,973 | B2 | * | 1/2018 | Engl | ..................... | H05K 1/181 |
| 2010/0246143 | A1 | * | 9/2010 | Dinh | .................... | H05K 9/0028 |
| | | | | | | 361/748 |
| 2013/0153286 | A1 | * | 6/2013 | Kim | ......................... | H05K 3/00 |
| | | | | | | 174/377 |
| 2018/0279515 | A1 | * | 9/2018 | Gloster | ............... | H05K 9/0026 |

* cited by examiner

*Primary Examiner* — Hung V Ngo
(74) *Attorney, Agent, or Firm* — Schwabe, Williamson & Wyatt, P.C.

(57) ABSTRACT

Apparatus and method for providing an electromagnetic interference (EMI) shield for removable engagement with a printed circuit board (PCB). A shaped electrically conductive member has a substantially planar member portion with multiple lateral member edges. The sidewalls are disposed at respective lateral member edges and are substantially orthogonal to the substantially planar member portion. At least one of the sidewalls includes at least one first snap-fit latching feature to engage a respective complementary second snap-fit latching feature disposed at one or more of multiple peripheral portions of a PCB.

20 Claims, 15 Drawing Sheets

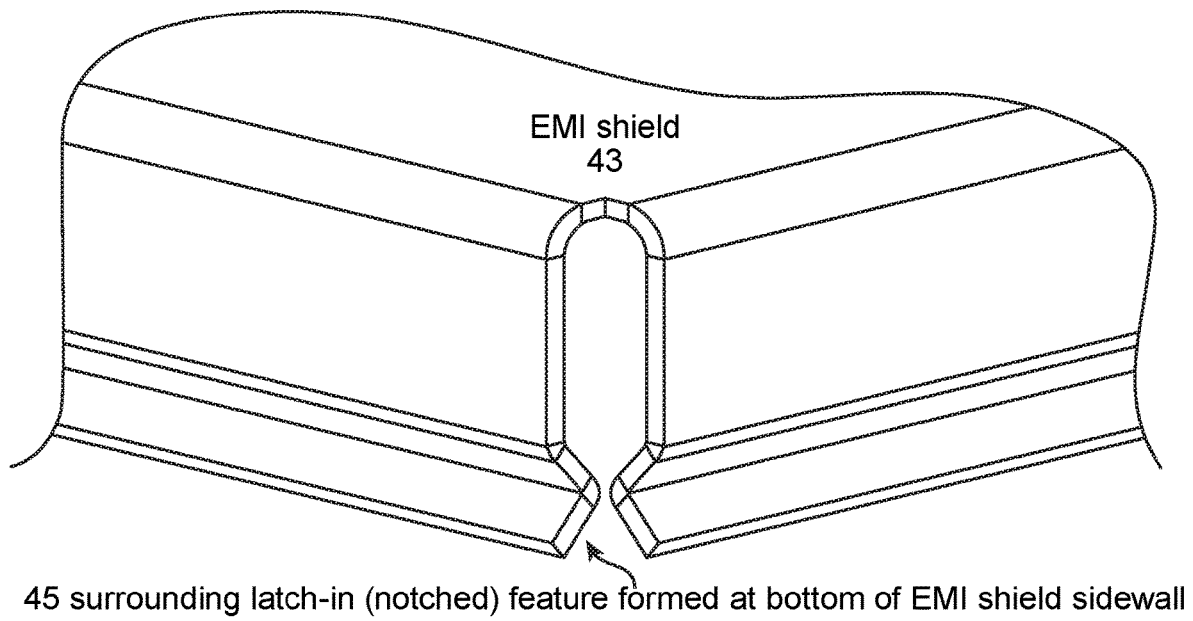
45 surrounding latch-in (notched) feature formed at bottom of EMI shield sidewall
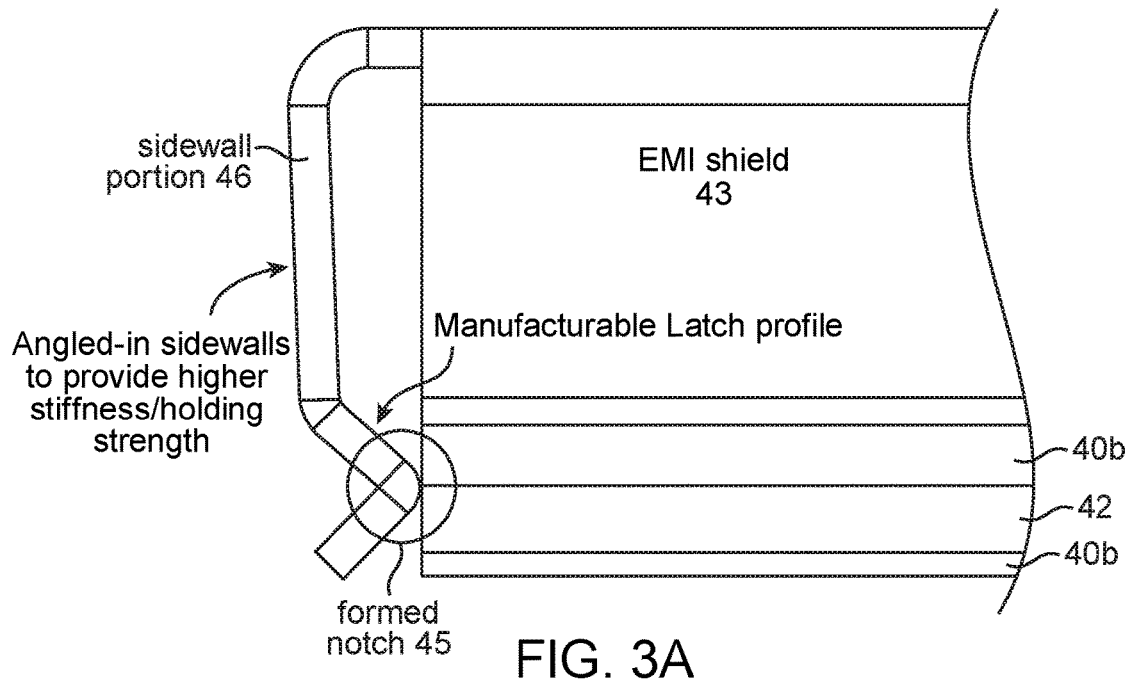
FIG. 3A

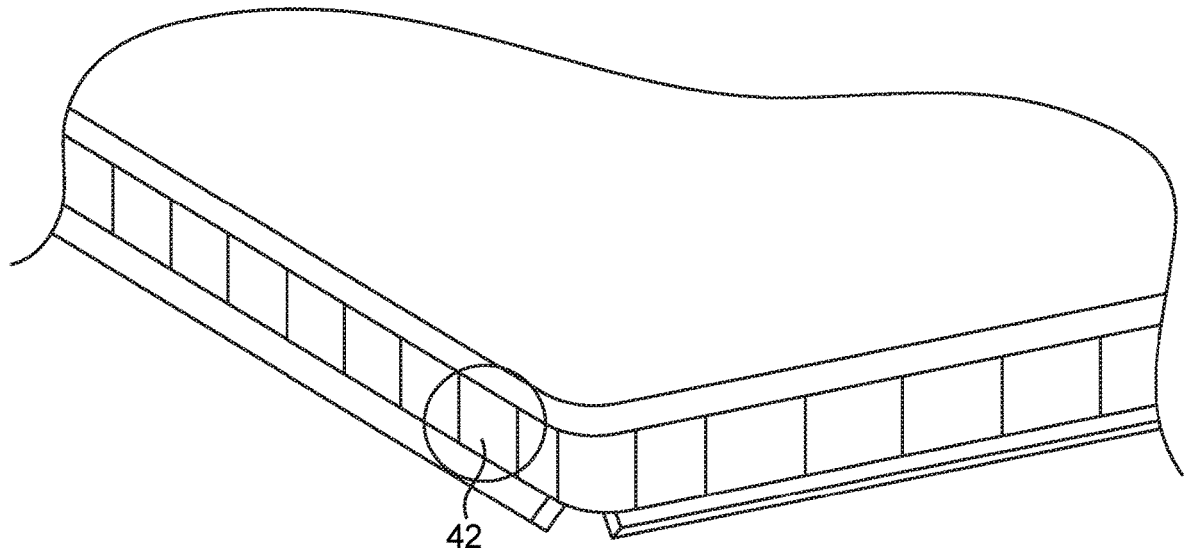
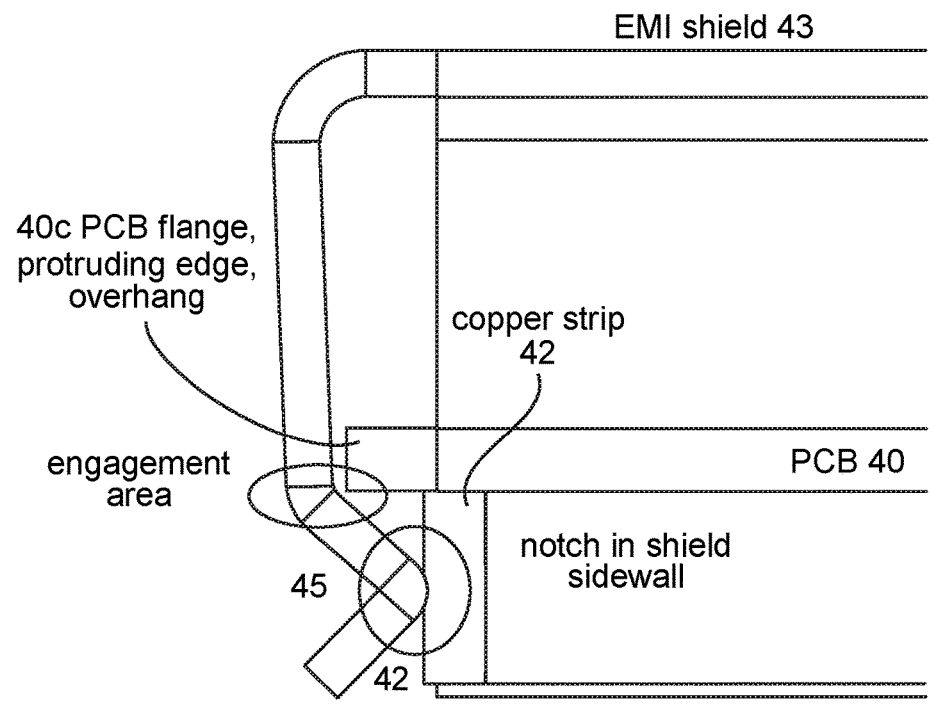
Design-to-interfere latches at all 4 edges will ensure grounding contact with side Copper strips
FIG. 3B

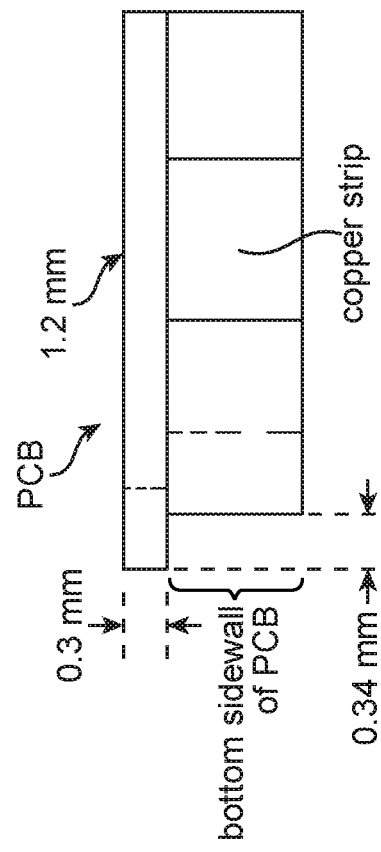
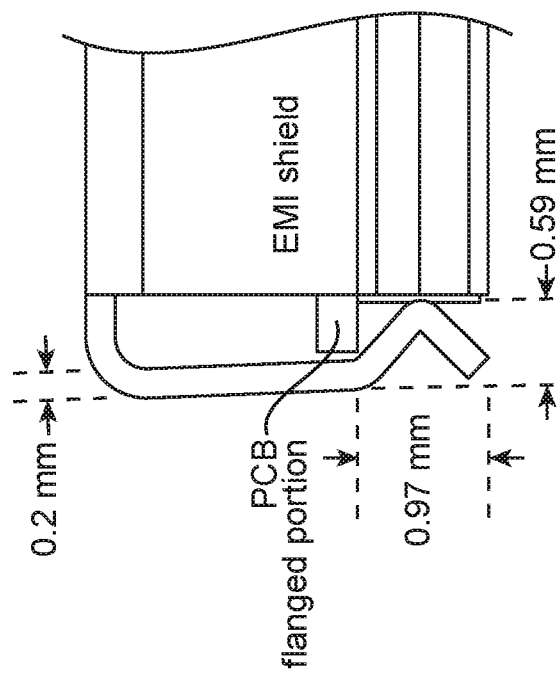
FIG. 4

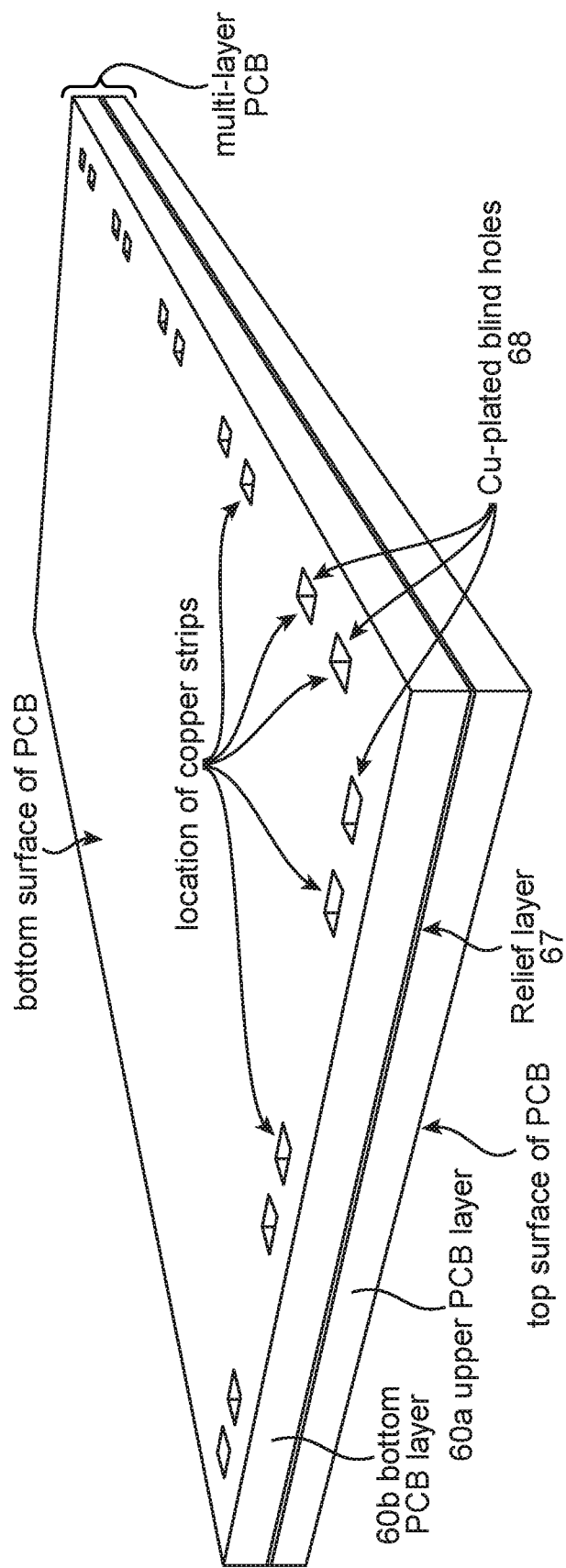
FIG. 5A Plated Blind Via, Laser/Precision Cut and removal of relief film

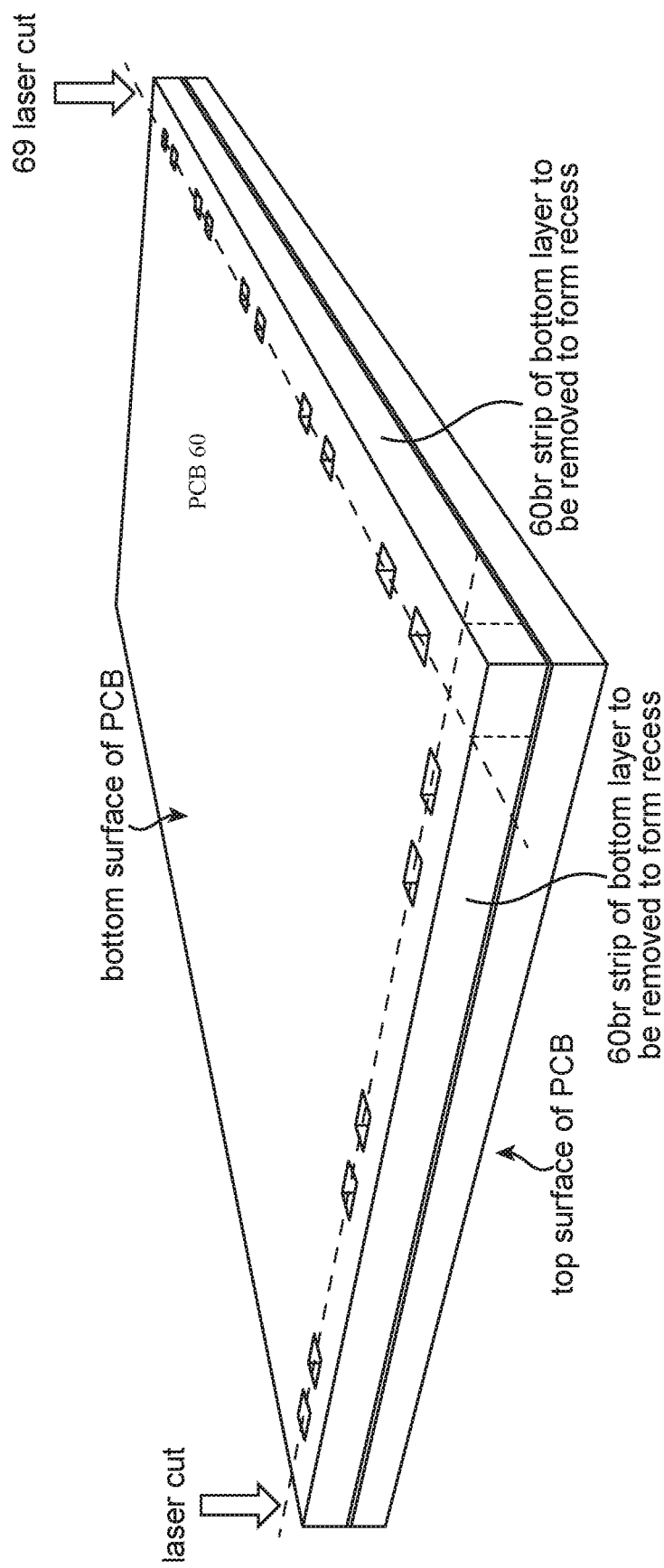
FIG. 5B Laser/Precision Cut and removal of relief film

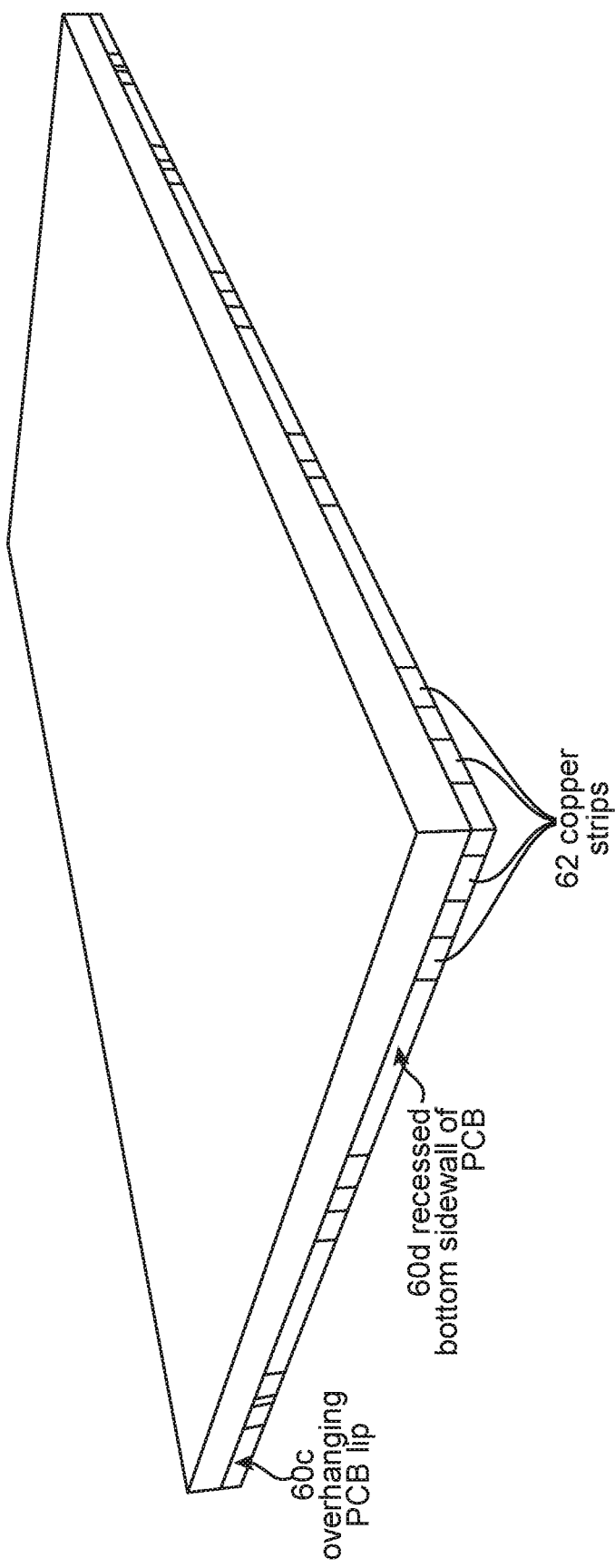
FIG. 5C Final PCB board after flip over

ELECTROMAGNETIC INTERFERENCE (EMI) SHIELD FOR CIRCUIT CARD ASSEMBLY (CCA)

BACKGROUND

The present disclosure relates to an electromagnetic interference (EMI) shield for a printed circuit board (PCB), and in particular to PCBs on which radio frequency (RF) signals and/or signals having high slew rates are conducted via conductive signal paths.

As electronic integrated circuits (ICs) have become more miniaturized and denser, the number of signal lines needed to support them has increased significantly. This has resulted in more emissions of, as well as susceptibility to, RF interference (RFI) as well as electromagnetic interference (EMI), especially for signals conducted over surface (external) conductors. Techniques to compensate or remedy this have included embedding high frequency signals (e.g., RF and high slew rate signals) as part of an internal conductive layer within the PCB. However, this is generally impractical for short signal paths, may not always be possible for some surface mount devices, and cannot effectively shield the device mounting holes. Further, such technique increases the number of board layers, complexity of the resulting inter-layer interconnects and signal path lengths, thereby increasing PCB costs and decreasing efficiencies of bypass capacitors due to the resulting increased line inductance of the longer signal paths.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings:

FIG. 3A illustrates corner and edge views prior to and after engagement with an EMI shield, respectively, in accordance with example embodiments.

FIG. 3B illustrates corner and edge views prior to and after engagement with an EMI shield, respectively, in accordance with further example embodiments.

FIG. 4 illustrates examples of manufacturing dimensions for an EMI shield and PCB board in accordance with example embodiments.

FIGS. 5A-5C illustrate a PCB with an inter-layer relief film and placement of plated blind vias and locations for PCB cuts to form a PCB in accordance with example embodiments.

DETAILED DESCRIPTION

Figure 1A:
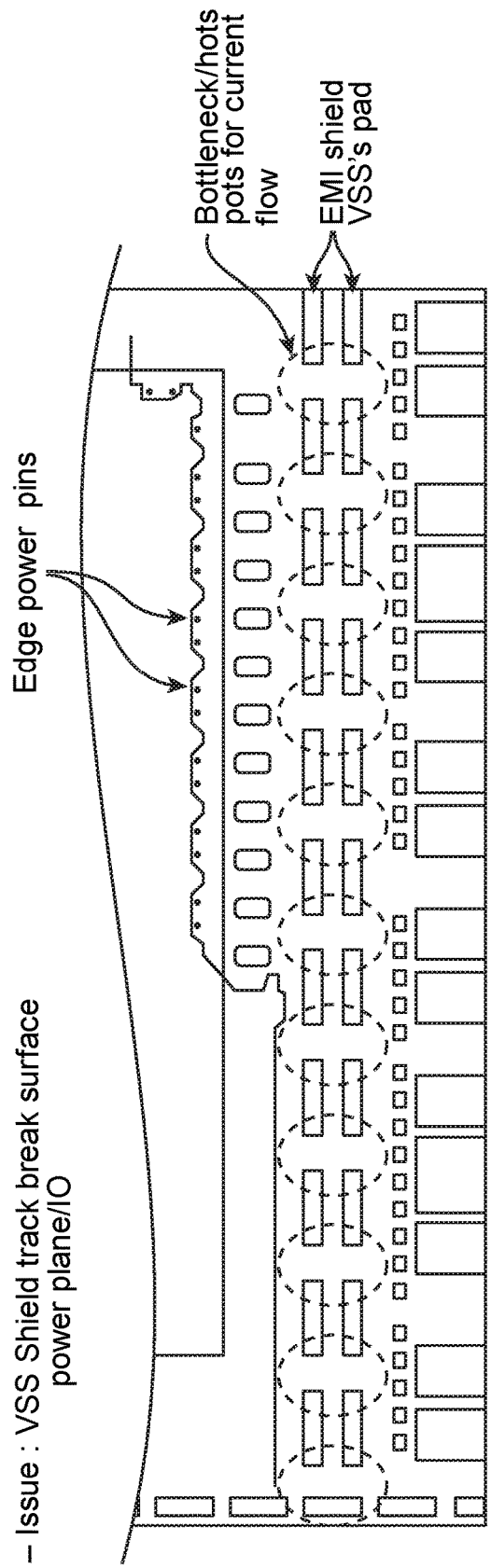
FIG. 1A illustrates a PCB mounting surface with conventional paths for VSS/ground conductors to accommodate an EMI shield.

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

As discussed in more detail below, example embodiments make use of existing PCB board edge areas, often referred to as Route Keep Out Zone areas (e.g., 500 um from the board edge), that have typically been unused. Additionally, new locking mechanisms are used in forms of latching structures at the edges and/or on the feet of EMI shield sidewalls. Example embodiments further use recesses along bottom sidewalls of the PCB. The resulting latching structures engage with (e.g., latch onto) the recesses and may obviate need for conventional mounting holes previously used to hold the EMI shield in place. The EMI shielding effect may be enhanced by further including EMI conductive gasket material between the shield and exposed conductive layer (e.g., copper strips) along the recesses of the PCB sidewall, which may be electrically part of the VSS/ground plane.

Such structures and techniques advantageously enable reductions in required PCB surface area by Board XY area reduction by avoiding needs for multiple EMI shields and mounting holes on the PCB. This may also enable use of a single EMI shield, rather than multiple shields, as well as minimize, or even prevent, warping of such single EMI shield. Further avoided is a need to have a VSS/ground plane conductor available as part of a PCB surface conductor layer. As a result, the total PCB surface area may be reduced, and thereby enable a smaller form factor.

Further advantages may include: improved electrical power performance enabled by a resulting ability to employ a power plane having a larger surface area and reduced loop inductance for high current power lines; a reduction in the number of PCB layers with surface layers now available for routing of power lines; and reduced costs for fully assembled PCBs due to reduced need for more than a single EMI shield, mounting holes and surface mount processes to attach multiple EMI shields to the PCB.

Conventional EMI shield implementations often require use of VSS/ground conductors and PCB mounting holes. Disadvantages of these features, as noted above, may be advantageously overcome with use of latched EMI shields in accordance with example embodiments that reduce required PCB surface area. This has become and continues to be a critical advantage in mobile small form factor platform designs (e.g., handheld devices such as smartphones).

For example, in the case of area occupied by VSS/ground conductors, each EMI shield is typically designed with a long VSS/ground conductor along the shield sidewall. These are designed to enable the shield to be soldered onto the PCB to ensure the shield is grounded to internal ground layers of the PCB. An original equipment manufacturer (OEM) often employs multiple shields on a single PCB since a single large form factor EMI shield often experiences warping during its surface mount process (e.g., due to heat of the soldering process) and thereby becomes unreliably or inconsistently connected to circuit ground on the PCB surface. In the case of area occupied by EMI shield mounting holes, a large EMI Shield will need mounting holes to increase its hold onto the PCB.

In the case of electrical performance and system height (due to the height of the thickest surface component combined with the thickness of the PCB), a surface power plane (e.g., for VDD and/or VSS/ground) offers minimized loop inductance paths from a central processing unit (CPU) to edge capacitors and the voltage regulator. However, VSS/ground conductors provided primarily for EMI shield mounting create voids along surface power plane that introduce bottlenecks in power supply current flow. As a result, power routing is often required to be pushed below within the PCB (e.g., to level 3 (L3)), which often increases the number of board layers and, therefore, overall system height, as well as costs.

FIG. 1A illustrates a PCB mounting surface with conventional paths for VSS/ground conductors to accommodate an EMI shield. As will be readily appreciated, and as indicated, this creates bottlenecks/hotspots for current flow, thereby causing high impedance/inductance for critical VDD/VCC power lines.

Figure 1B:
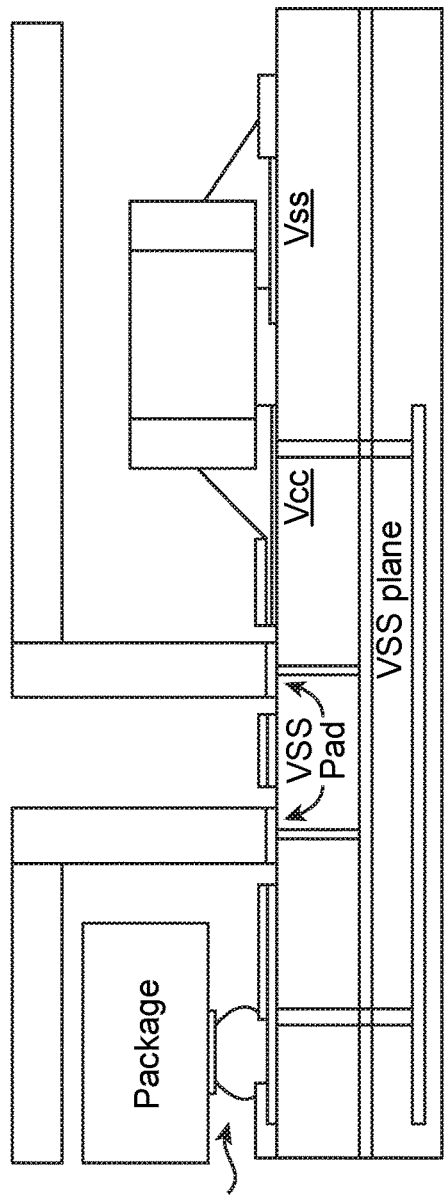
FIG. 1B illustrates a cross sectional view of a conventional PCB for which an EMI shield implementation forces VSS/ground lines to be routed edge capacitors on the surface layer via an embedded conductive layer within the PCB.

FIG. 1B illustrates a PCB mounting surface with conventional paths for VSS/ground conductors to accommodate an EMI shield. As noted, conventional shielding techniques have necessitated use of VSS/ground conductors (e.g., in the form of lines and/or planes) embedded within the PCB as shown (e.g., between the PCB component mounting surface and an embedded power supply VCC plane), resulting in thicker and more costly PCB construction, plus longer conductive paths to/from VSS/ground that introduce increased line inductance and current-resistance (IR) losses (e.g., in the form of power and voltage drops).

Figure 2A:
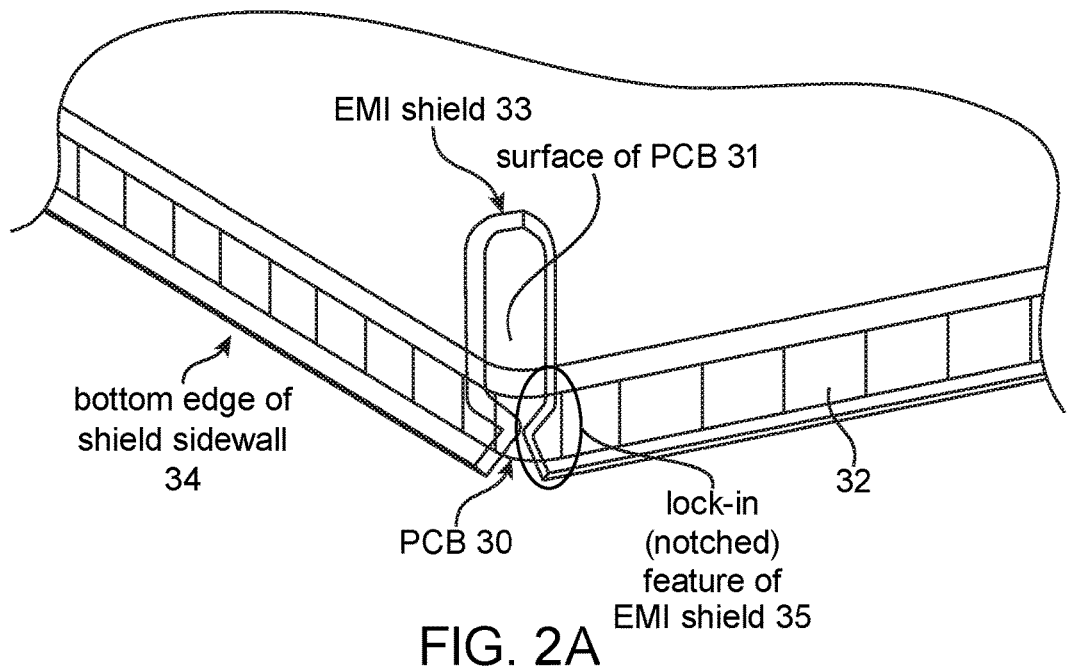
FIG. 2A illustrates engagement of an EMI shield with a PCB in accordance with example embodiments.

FIG. 2A illustrates engagement of an EMI shield with a PCB in accordance with example embodiments. As discussed in more detail below, a PCB 30 having a component mounting surface 31 and exposed conductors 32 (e.g., in the form of vertical conductive strips 32 exposed at peripheral edges of a lower portion of the PCB 30) may be engaged with an EMI shield 33 having multiple sidewalls 34 that may securely engage (e.g., via locking, or notched, features 35) with protruding peripheral edges of an upper portion of the PCB 30.

For example, the unique fit design of the latching structure 35 and recessed lower PCB portion edges may be incorporated in all sidewalls of the PCB 30 to enable a locking and binding effect from all ("XYZ") directions and thereby ensure mechanical integrity of the resulting engagement. Advantageously, this locking mechanism obviates need(s) for conventional mounting holes and VSS pads (as discussed above). The direct mechanical contact of the inner edges of the locking features 35 near the bottom of the sidewalls provides electrical connection(s) between the EMI shield (which is fabricated of electrically conductive material, may types of which are well known in the art) and the exposed conductors 32 which are part of the VSS/ground plane of the PCB 30. Additionally, as needed or otherwise desired, further grounding improvements may be achieved by including EMI gasket material (not shown) along and between the inner edges of the locking features 35 of the sidewalls and the exposed conductors 32.

Figure 2B:
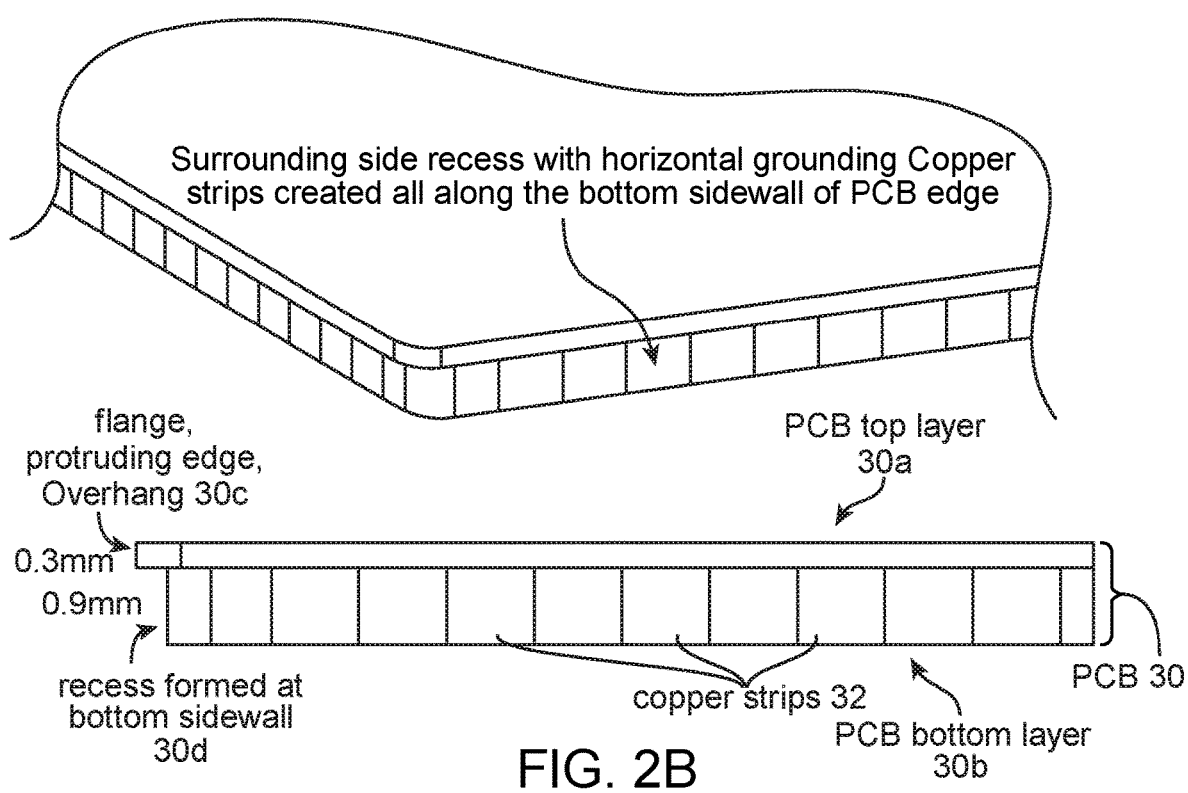
FIG. 2B illustrates edge views of a PCB board prior to engagement with an EMI shield in accordance with example embodiments.

FIG. 2B illustrates edge views of a PCB board prior to engagement with an EMI shield in accordance with example embodiments. Here it can be more easily seen how, in accordance with example embodiment, the PCB 30 may have a thinner (e.g., 0.3 mm) upper layer 30a and a thicker (e.g., 0.9 mm) recessed lower 30b layer (discussed in more detail below), thereby enabling the locking features 35 of the EMI shield sidewalls to latch with the protruding edges 30c of the upper PCB layer 30a and make electrical contact with exposed conductors 32 within the recesses 30d formed by the lower PCB layer 30b.

FIG. 3A illustrates corner and edge views prior to and after engagement with an EMI shield, respectively, in accordance with example embodiments. As discussed above, the EMI shield includes multiple sidewalls 36 (e.g., four for a rectangularly formed shield) terminated below in locking features 35 having surfaces for making electrical contact with exposed conductors 32 formed as part of a conductive layer embedded within the lower PCB layer 30b (discussed in more detail below). As will be readily appreciated by those skilled in the art, the sidewalls 36 may be fabricated together with the top of the EMI shield as part of a unitary construction or, alternatively, separately for subsequent bonding (e.g., via welding, soldering, riveting, conductive adhesive, etc., in accordance with known principles) with the top of the EMI shield.

FIG. 3B illustrates corner and edge views engagement with an EMI shield in accordance with further example embodiments. As discussed above, the EMI shield sidewalls 46 are terminated below in locking features 45 having surfaces for making electrical contact with exposed conductors 42 at the peripheral edges of the PCB 40 and designed for interference engagement with protruding edges 40c of the PCB 40 (e.g., as a cantilever latching mechanism).

In accordance with further example embodiments, similar to an EMI shield with locking slots engaged with a gradient PCB, as discussed below for FIG. 8, sidewalls 46 of this EMI shield 43 may be designed to accommodate different heights of a gradient PCB. Accordingly, such an EMI shield 43 for engagement with a gradient PCB having segments with different heights would have correspondingly different shield sidewall 46 heights to engage with gradient PCB segments having protruding edges 40c at such different heights.

FIG. 4 illustrates examples of manufacturing dimensions (e.g., in millimeters) for an EMI shield and PCB board in accordance with example embodiments.

FIGS. 5A-5C illustrate a PCB with an inter-layer relief film and placement of plated blind vias and locations for PCB cuts to form a PCB in accordance with example embodiments. Fabrication of such a PCB may proceed in accordance with known principles by first fabricating a multi-layer PCB in which the upper 60a and lower 60b layers are separated by a relief layer 67 (e.g., an anti-adhesive material). This may be followed by forming blind holes 68 in which their interiors are plated with conductive material (e.g., copper) to create what will ultimately become the exposed conductors 62 at the peripheral edges of the PCB 30. For example, referring to FIG. 5A, in accordance with known principles, multiple (e.g., two) PCB layer stacks are fabricated using standard board processes, separated by one or more relief films having size(s) to accommodate the desired lateral. Next, a plated blind hole process may be performed to produce holes (e.g., rectangular in shape) in a rectilinear pattern near the peripheral edges of the PCB to form what will become the grounding pads for competing EMI shielding.

Referring to FIG. 5B, next, in preparation for formation of the protruding portion 60c of the PCB 60, a precision cut (e.g., using a laser or saw) 69 may be applied through the PCB 60 to the depth of the relief film 67. The resulting unwanted PCB material may then be removed as the relief film, as an anti-adhesive material, may be peeled away. Referring to FIG. 6C, the resulting PCB 60 may then be inverted to be positioned for engagement with the EMI shield.

Figure 6:
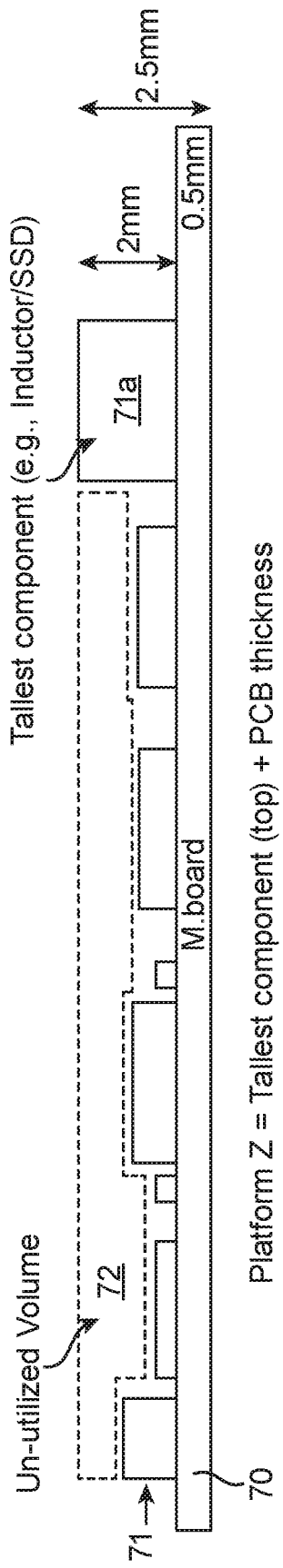
FIG. 6 illustrates a conventional single sided PCB with mounted devices having varying vertical dimensions (heights).

FIG. 6 illustrates a conventional single sided PCB with mounted devices having varying vertical dimensions (heights). A single PCB 70, which typically includes multiple conductive layers for power and signal paths, as discussed above, is populated with multiple components 71 having varying heights relative to the mounting surface of the PCB 70. As noted, since the mounted components 71 share the same mounting surface, this results in an unused volume of space 72 above the mounted components 71 having a height relative to the PCB mounting surface that is coextensive with the height of the tallest mounted component 73.

Figure 7:
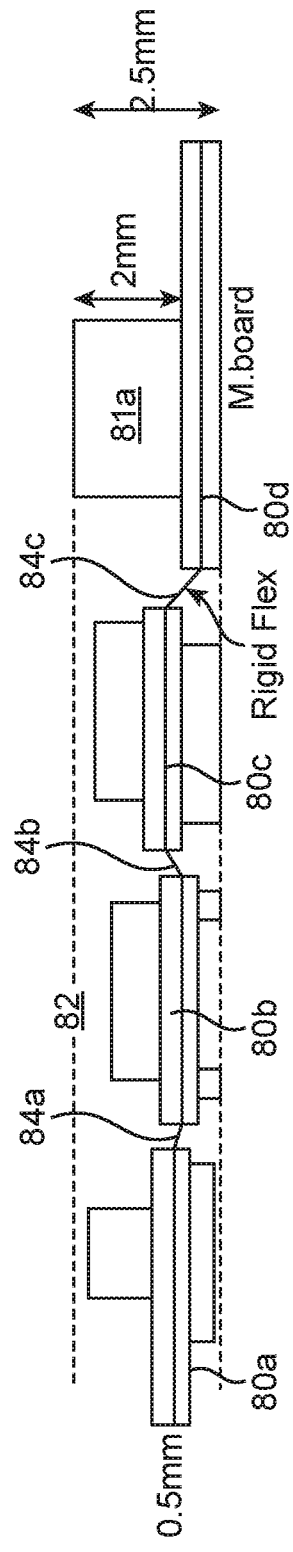
FIG. 7 illustrates a gradient PCB with mounted devices having varying vertical dimensions (heights) for engagement with an EMI shield in accordance with example embodiments.

FIG. 7 illustrates a gradient PCB with mounted devices having varying vertical dimensions (heights) for engagement with an EMI shield in accordance with example embodiments.

With a gradient PCB implementation, multiple single sided PCBs 80a, 80b, 80c, 80d may be used in combination such that the maximum height (or thickness Z) dimension of the system (with all included single sided PCBs) may be minimized to the sum of the tallest component 81a and the PCB 80d thickness. Accordingly, unused system volume 82 (e.g., between such maximum height dimension and the height dimension of the shortest (or lowest profile) component(s) on the PCB 80b) is minimized. Such a gradient PCB platform includes a PCB design where modular segments of associated PCBs are electrically coupled by rigid flex conductors 84a, 84b, 84c and are fixed in place with certain inclinations, or gradients, relative heights of key mounted components on the PCBs 80a, 80b, 80c, 80d. Further, components may be mounted on inverse side(s) of the PCBs 80a, 80b, 80c on which the lower profile components are mounted. This advantageously enables at least a partial double sided PCB configuration, which further enables a gradient PCB system having higher component density and/or requiring reduced surface area.

Figure 8:
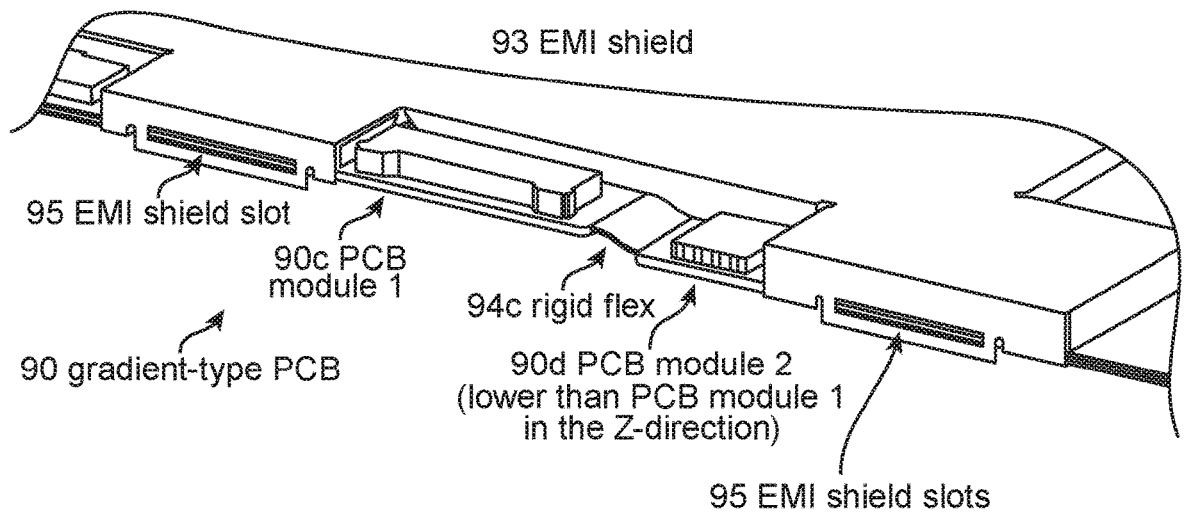
FIG. 8 illustrates an EMI shield with locking slots engaged with a gradient PCB in accordance with example embodiments.

FIG. 8 illustrates an EMI shield with locking slots engaged with a gradient PCB 90 in accordance with further example embodiments. This form of EMI shield 93, which may be particularly advantageous when implemented with gradient PCB members 90c, 90d, has sidewalls that include slots 95 to form a locking mechanism that works by engaging the slots 95 with tabs that may be formed as protruding parts of a layer of the PCB (discussed in more detail below). The slots 95 may be located in the EMI shield sidewalls at varying heights that depend upon the combined vertical dimensions of their associated PCB members 90c, 90d and mounted components so that, when engaged with the tabs along edges of the various PCB members 90c, 90d, the greatest vertical dimension of the full assemblage of PCB members may be limited to that of the tallest mounted component and its PCB member. Accordingly, a single piece EMI shield with slots 95 at different Z-levels (heights) may serve as a fixture to establish and maintain the different Z-gradients of the overall gradient PCB 90.

Figure 9:
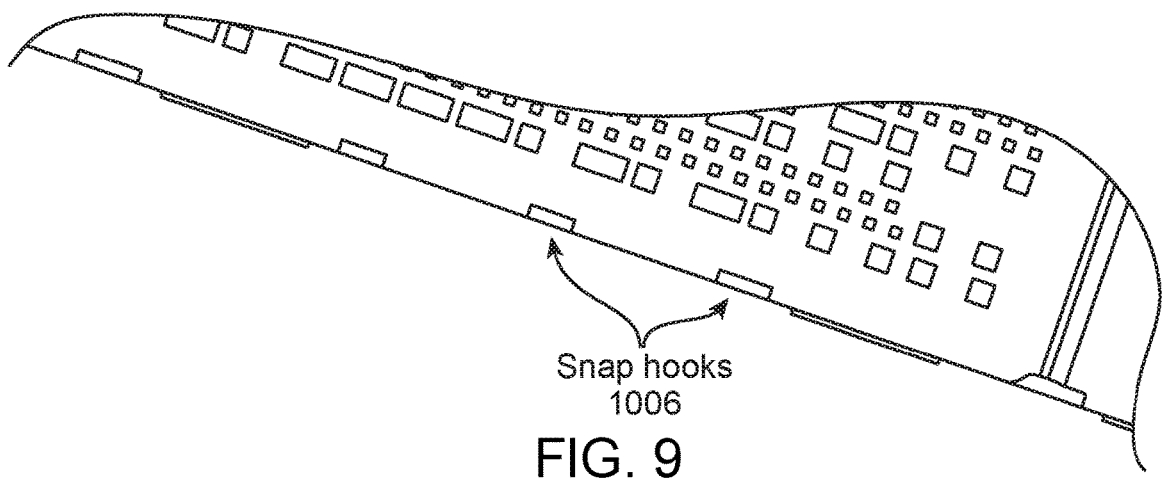
FIG. 9 illustrates an edge of a PCB with snap hooks for engagement with an EMI shield in accordance with example embodiments.

FIG. 9 illustrates an edge of a PCB with snap hooks 1006 to facilitate grounding when engaged with an EMI shield in accordance with example embodiments. Such snap hooks 1006 may be provided along bottom PCB surface edges to improve holding strength of the EMI shield.

Figure 10:
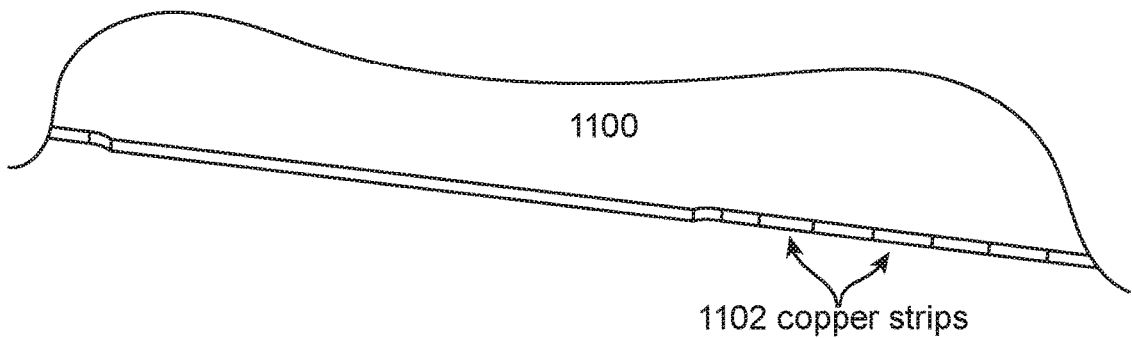
FIG. 10 illustrates an edge of a PCB with conductive strips for engagement with an EMI shield in accordance with example embodiments.

FIG. 10 illustrates an edge of a PCB 100 with conductive strips 1102 to facilitate grounding when engaged with an EMI shield in accordance with example embodiments. Such conductive strips 1102, when electrically part of the VSS/ground of the PCB as discussed above, may be used to enhance grounding of the EMI shield.

Figure 11:
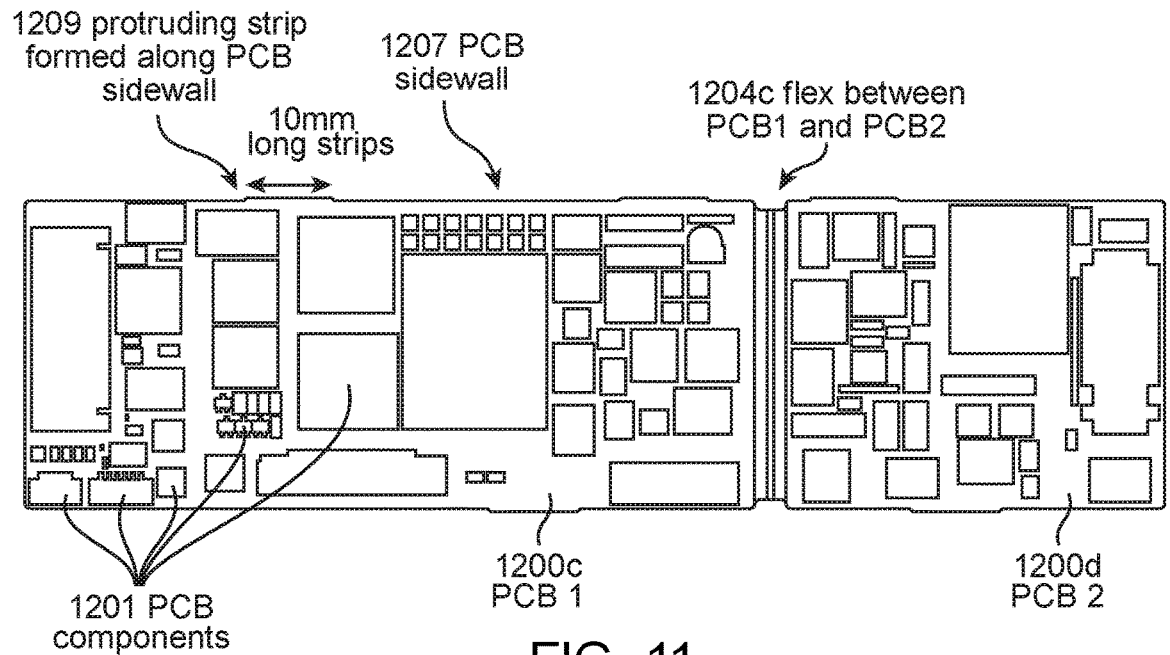
FIG. 11 illustrates a gradient PCB with edge protrusions for locking engagement with an EMI shield in accordance with example embodiments.

FIG. 11 illustrates a top view of a gradient PCB assembly with edge protrusions 1209 for locking engagement with an EMI shield (not shown) in accordance with example embodiments. As discussed above, each gradient PCB member 1200c, 1200d includes multiple tabs 1209 to interlock with slots in the sidewalls of an EMI shield (not shown) to establish and minimize the maximum height (or thickness) of the full gradient PCB assembly.

Figure 12:
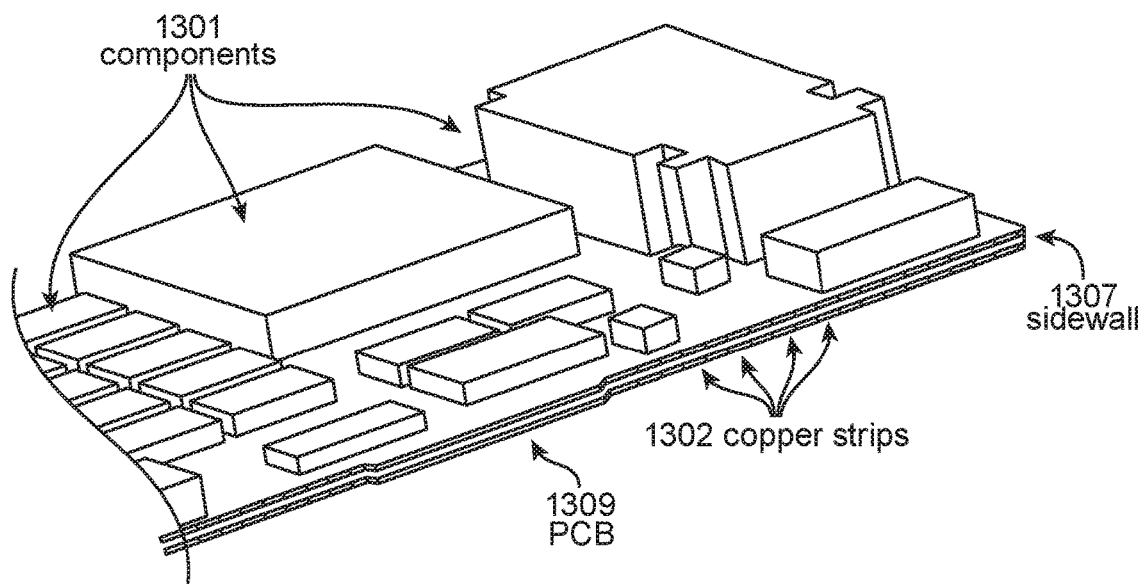
FIG. 12 illustrates a populated PCB with edge protrusions and conductive edge strips for engagement with an EMI shield in accordance with example embodiments.

FIG. 12 illustrates a populated PCB with edge protrusions 1309 and conductive edge strips 1302 for engagement with an EMI shield (not shown) in accordance with example embodiments.

Figure 13:
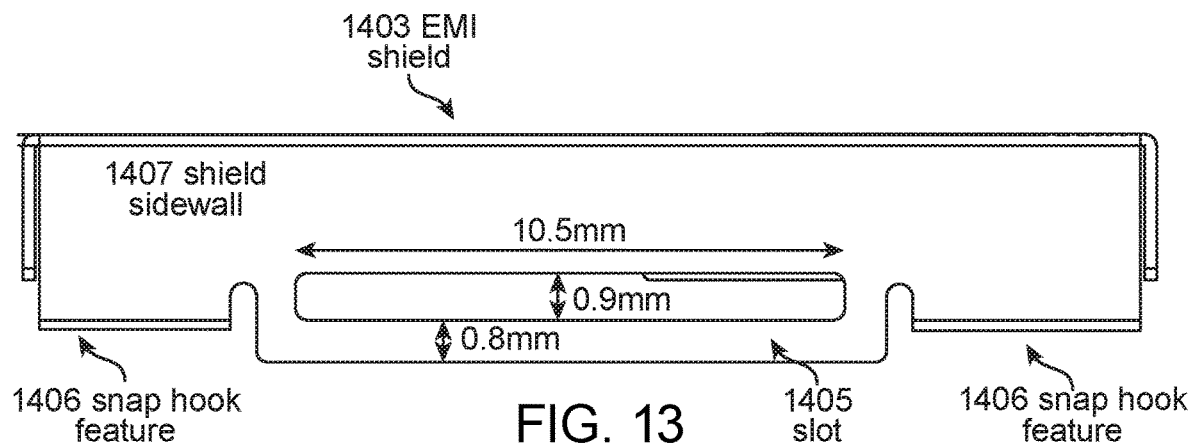
FIG. 13 illustrates example outer details of an EMI shield with locking slots for engagement with a gradient PCB in accordance with example embodiments.

FIG. 13 illustrates example outer details of an EMI shield 1403 with locking slots 1405 and snap hooks 1406 for engagement with a gradient PCB (not shown) in accordance with example embodiments.

Figure 14:
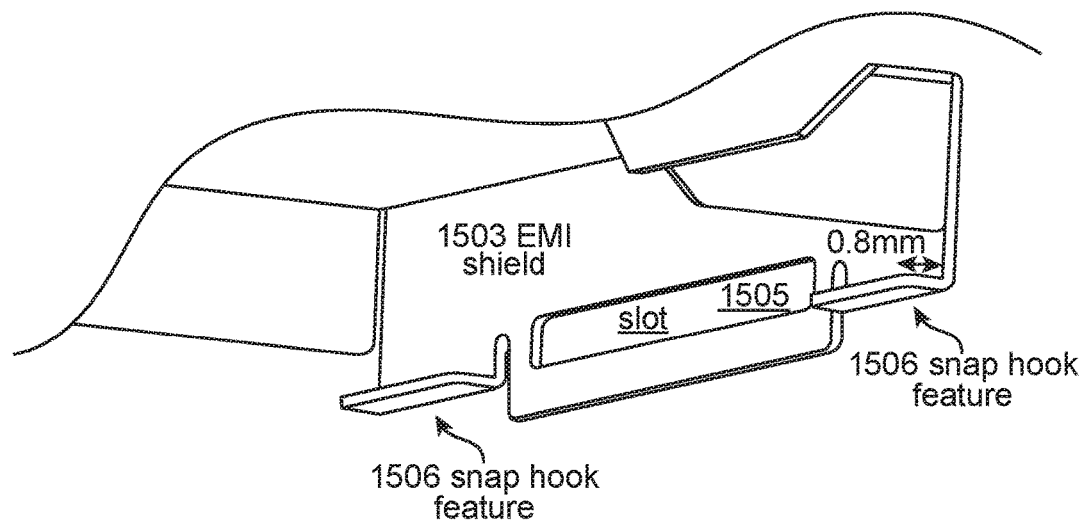
FIG. 14 illustrates example inner details of an EMI shield with locking slots and snap hooks for engagement with a gradient PCB in place in accordance with example embodiments.

FIG. 14 illustrates example inner details of an EMI shield 1503 with locking slots 1505 and snap hooks 1506 for engagement with a gradient PCB in place in accordance with example embodiments.

Figure 15:
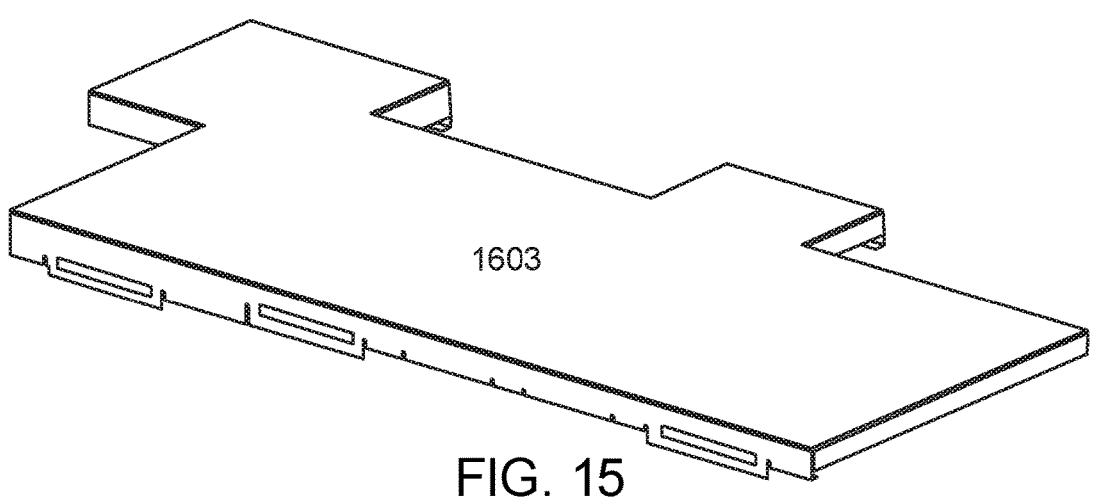
FIG. 15 illustrates an example of a EMI shield with locking slots and snap hooks for engagement with a gradient PCB in place in accordance with example embodiments.

FIG. 15 illustrates an example of a finished EMI shield 1603 with locking slots and snap hooks for engagement with a gradient PCB in place in accordance with example embodiments.

Figure 16A:
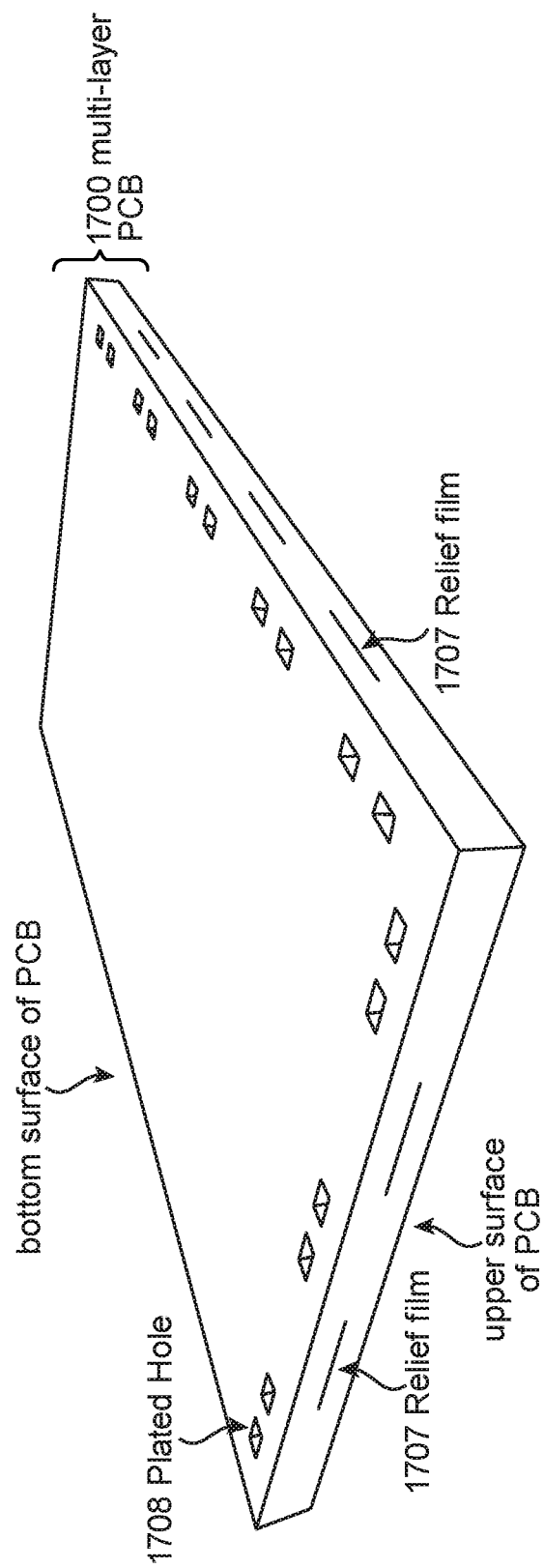
FIGS. 16A-16C illustrate stages of fabrication of a gradient PCB member in accordance with example embodiments.
Figure 16B:
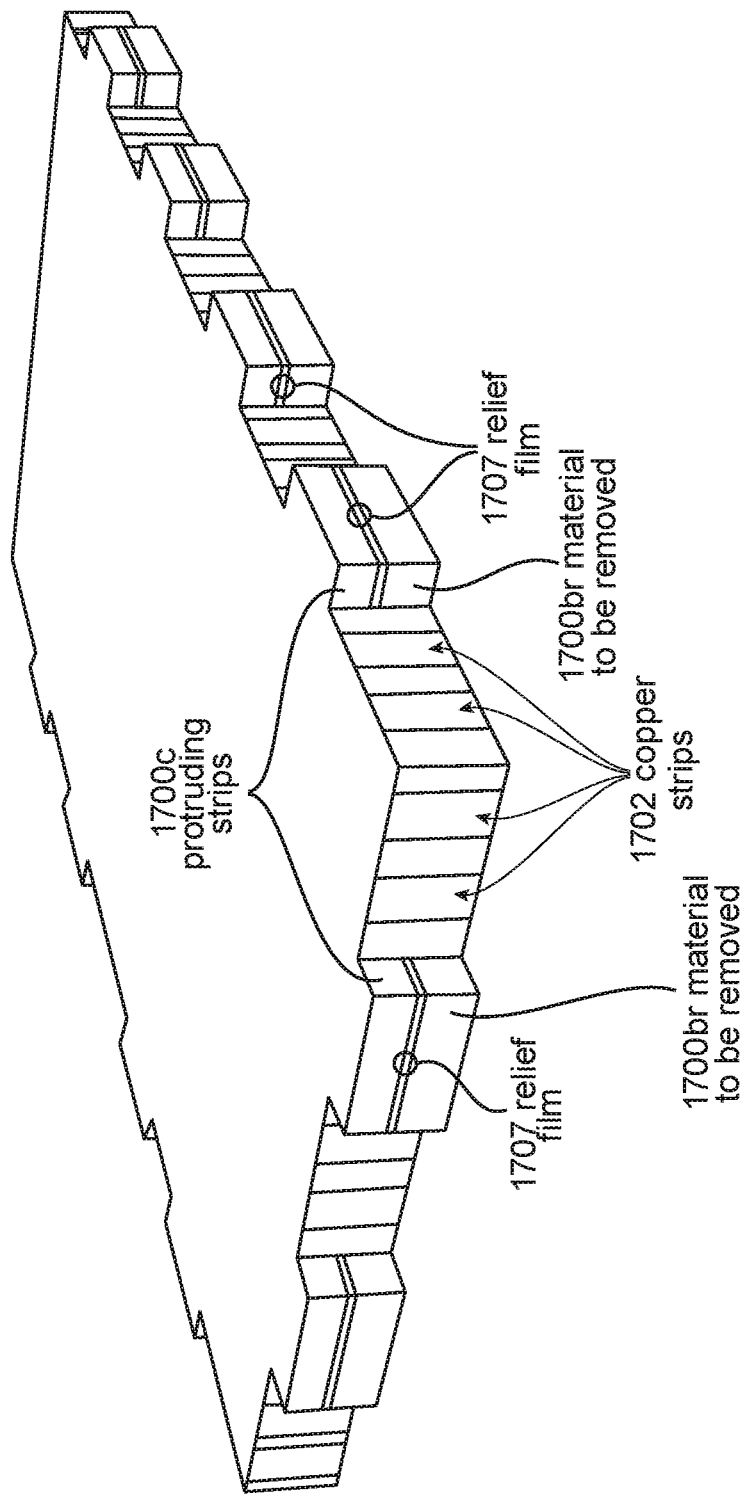
Figure 16C:
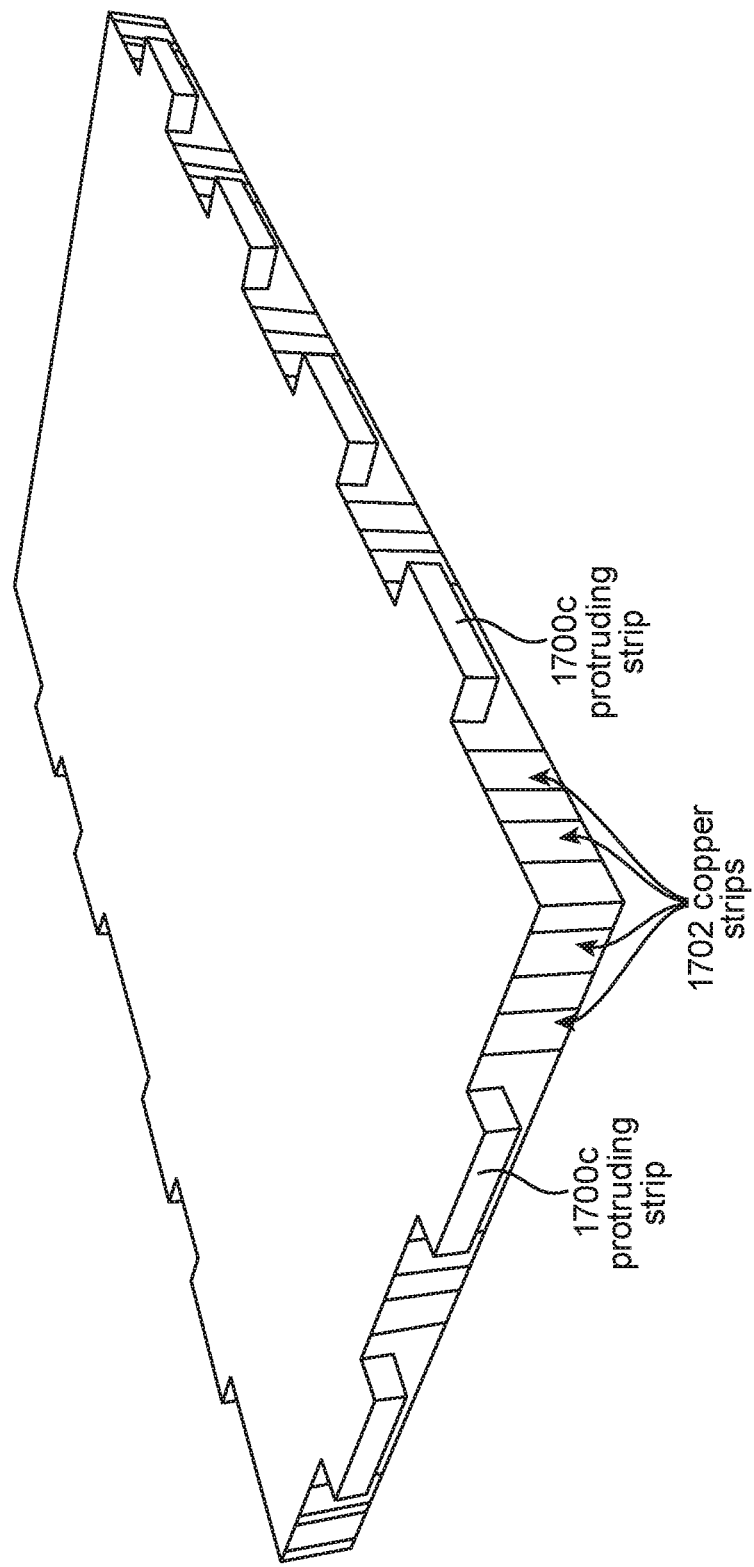

FIGS. 16A-16C illustrate stages of fabrication of a gradient PCB member in accordance with example embodiments. Following placement of plated blind vias, the PCB material is cut and/or routed, and its inter-layer relief film is removed. Referring to FIG. 16A, the PCB layer stacks are fabricated (e.g., prepared as discussed above for FIGS. 5A-5C) with relief film(s) 1707 commensurate with the final size(s) and shape(s) of the protruding strips 1700*c* (FIG. 16C). Boring and plating steps are performed to produce rectangular plated-through holes 1708 in a rectangular pattern near the edge of the board, each of which has the width of the final edge conductors 1702 (FIG. 16B).

Referring to FIG. 16B, the gradient PCB member 1700*c* is then cut and/or routed to the inner edge of the rectangular plated-through holes 1708 to create the exposed edge conductors 1702 (connected, as discussed above, to the internal ground plane to optimize EMI shielding) and to also produce what will become protruding strips 1700*c* and corresponding PCB material 1700*br* to be removed prior to removal of the inter-layer relief film 1707.

Referring to FIG. 16C, following removal of the sacrificial PCB material 1700*br*, and inter-layer relief film 1707, the PCB structure may be inverted in preparation for populating it with components (not shown) and engagement with an EMI shield (not shown).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the foregoing and following description and the following claims, the term "coupled" along with its derivatives, may be used. "Coupled" is used to indicate that two or more elements cooperate or interact with each other, but they may or may not have intervening physical or electrical components between them.

As used in the claims, unless otherwise specified, the use of the ordinal adjectives "first", "second", "third", etc., to describe a similar element, merely indicate that different instances of such elements are being recited, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of operation described herein may be changed and are not limited to the manner described herein. Moreover, actions of any operation flow need not be implemented in the order described, nor do all actions necessarily need to be performed. Also, those actions that are not dependent on other actions may be performed in parallel with the other actions.

Method examples described herein may be implemented, at least in part, with nor or more machines or computing devices. Some examples may include a computer-readable medium or machine-readable medium encoded with instructions operable to configure an electronic device to perform methods as described in the examples disclosed herein. An example implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, without limitation, hard disks, removable magnetic disks, removable optical disks (e.g., compact disks and digital video disks), magnetic cassettes, memory cards or sticks, random access memory (RAM), read only memory (ROM), and the like.

The following examples pertain to further embodiments. The various features of the different embodiments may be variously combined with some features included and others excluded to suit a variety of different applications.

Some embodiments pertain to an apparatus including an electromagnetic interference (EMI) shield for removable engagement with a printed circuit board (PCB) and that includes: a shaped electrically conductive member having a substantially planar member portion with a plurality of lateral member edges; and a plurality of sidewalls disposed at respective ones of the plurality of lateral member edges and substantially orthogonal to the substantially planar member portion, wherein each of at least a portion of the plurality of sidewalls includes at least one of a plurality of first snap-fit latching features to engage a respective one of a plurality of complementary second snap-fit latching features disposed at one or more of a plurality of peripheral portions of a PCB.

In further embodiments, the shaped electrically conductive member and at least a portion of the plurality of sidewalls include a unitary construction.

In further embodiments, wherein adjacent ones of at least a portion of the plurality of sidewalls are separated by a gap.

In further embodiments, the first snap-fit latching feature is distal to the substantially planar member portion.

In further embodiments, the first snap-fit latching feature is disposed within a medial portion of the sidewall.

In further embodiments, the first and second snap-fit latching features form a cantilever latching mechanism.

In further embodiments, further included is a printed circuit board (PCB) that includes: a substrate comprising an electrically insulative material having a substantially planar substrate surface with a plurality of peripheral substrate edges; and an internal electrically conductive layer disposed within at least a portion of the substrate and at least partially exposed via one or more portions of at least one of the plurality of peripheral substrate edges, wherein the at least partially exposed internal electrically conductive layer includes a plurality of alternating exposed portions and is further disposed to engage with at least one of the plurality of first snap-fit latching features.

Some embodiments pertain to an apparatus including an electromagnetic interference (EMI) shield for removable engagement with a printed circuit board (PCB) and that includes: a shaped EMI shielding means having a substantially planar member portion with a plurality of lateral member edges for attenuating incident electromagnetic signals; and sidewall EMI shielding means disposed at respective ones of the plurality of lateral member edges and substantially orthogonal to the substantially planar member portion for attenuating incident electromagnetic signals, wherein at least a portion of the sidewall means includes at least one of a plurality of first snap-fit latching means for engaging a respective one of a plurality of complementary second snap-fit latching means disposed at one or more of a plurality of peripheral portions of a PCB.

In further embodiments, the shaped EMI shielding means and at least a portion of the sidewall EMI shielding means include a unitary construction.

In further embodiments, adjacent portions of the sidewall EMI shielding means are separated by a gap.

In further embodiments, the first snap-fit latching means is distal to the substantially planar member portion.

In further embodiments, the first snap-fit latching means is disposed within a medial portion of the sidewall EMI shielding means.

In further embodiments, the first and second snap-fit latching means form a cantilever latching mechanism.

In further embodiments, further included is a printed circuit board (PCB) that includes: electrically insulative substrate means having a substantially planar substrate surface with a plurality of peripheral substrate edges for mounting thereon a plurality of electronic circuit components; and internal electrical conductor means for conducting electrical signals among the plurality of electronic circuit components, and disposed within at least a portion of the electrically insulative substrate means and at least partially exposed via one or more portions of at least one of the plurality of peripheral substrate edges, wherein the at least partially exposed internal electrical conductor means includes a plurality of alternating exposed portions and is further disposed to engage with at least a portion of the first snap-fit latching means.

Some embodiments pertain to a method for providing an electromagnetic interference (EMI) shield for removable engagement with a printed circuit board (PCB) and that includes: forming a shaped electrically conductive member having a substantially planar member portion with a plurality of lateral member edges; forming a plurality of sidewalls disposed at respective ones of the plurality of lateral member edges and substantially orthogonal to the substantially planar member portion; and forming, within each of at least a portion of the plurality of sidewalls, at least one of a plurality of first snap-fit latching features to engage a respective one of a plurality of complementary second snap-fit latching features disposed at one or more of a plurality of peripheral portions of a PCB.

In further embodiments, the forming a shaped electrically conductive member and forming at least a portion of the plurality of sidewalls comprise forming a unitary construction.

In further embodiments, adjacent ones of at least a portion of the plurality of sidewalls are separated by a gap.

In further embodiments, the first snap-fit latching feature is distal to the substantially planar member portion.

In further embodiments, the first snap-fit latching feature is disposed within a medial portion of the sidewall.

In further embodiments, the first and second snap-fit latching features form a cantilever latching mechanism.

In further embodiments, further included is providing a printed circuit board (PCB) that includes: forming a first substrate layer comprising an electrically insulative material having a first substantially planar substrate surface with a first plurality of peripheral substrate edges; forming an electrically conductive layer disposed on at least a portion of the first substantially planar substrate surface; and forming a second substrate layer comprising an electrically insulative material having a second substantially planar substrate surface with a second plurality of peripheral substrate edges disposed on the electrically conductive layer and a portion of the first substantially planar substrate surface; wherein the internal electrically conductive layer is at least partially exposed at one or more portions of at least adjacent ones of the first and second pluralities of peripheral substrate edges, and the at least partially exposed electrically conductive layer includes a plurality of alternating exposed portions and is further disposed to engage with at least one of the plurality of first snap-fit latching features.

The above description illustrates various embodiments of the present disclosure along with examples of how aspects of the particular embodiments may be implemented. The above examples should not be deemed to be the only embodiments and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An apparatus including an electromagnetic interference (EMI) shield for removable engagement with a printed circuit board (PCB), comprising:
    a shaped electrically conductive member having a substantially planar member portion with a plurality of lateral member edges; and
    a plurality of sidewalls disposed at respective ones of the plurality of lateral member edges and substantially orthogonal to the substantially planar member portion;
    wherein the PCB includes at least an upper layer and a lower layer, with the lower layer having edges that are recessed from edges of the upper layer such that the edges of the upper layer respectively protrude and overhang the edges of the lower layer;
    wherein the shaped electrically conductive member and the plurality of sidewalls of the apparatus completely enclose at least a top surface of the upper layer and sidewalls disposed at edges of the upper and lower layers of the PCB;
    wherein each of at least a portion of the plurality of sidewalls of the apparatus includes at least one of a plurality of first snap-fit latching features to engage a respective one of a plurality of complementary second snap-fit latching features disposed at one or more of the plurality of edges of the upper and lower layers of the PCB, wherein the plurality of complementary second snap-fit latching features are the protruding edges of the upper layer and the sidewalls of the edges of the lower layer of the PCB;
    wherein the plurality of first snap-fit latching features are to engage the respective sidewalls of the edges of the lower layer of the PCB underneath the overhang edges of the upper layer of the PCB.

2. The apparatus of claim 1, wherein the shaped electrically conductive member and at least a portion of the plurality of sidewalls of the apparatus comprise a unitary construction.

3. The apparatus of claim 1, wherein adjacent ones of at least a portion of the plurality of sidewalls of the apparatus are separated by a gap.

4. The apparatus of claim 1, wherein each one of the plurality of first snap-fit latching features is distal to the substantially planar member portion.

5. The apparatus of claim 1, wherein each one of the plurality of first snap-fit latching features is disposed within a medial portion of one of the sidewalls of the apparatus.

6. The apparatus of claim 1, wherein the at least one of a plurality of first snap-fit latching features and the respective one of a plurality of complementary second snap-fit latching features together form a cantilever latching mechanism.

7. The apparatus of claim 1, further comprising the printed circuit board (PCB), wherein at least one of the upper or lower layer comprises:
- a substrate comprising an electrically insulative material having a substantially planar substrate surface; and
- an internal electrically conductive layer disposed within at least a portion of the substrate.

8. An apparatus including an electromagneticinterference (EMI) shield for removable engagement with a printed circuit board (PCB), comprising:
a shaped EMI shielding means having a substantially planar member portion with a plurality of lateral member edges for attenuating incident electromagnetic signals; and
sidewall means disposed at respective ones of the plurality of lateral member edges and substantially orthogonal to the substantially planar member portion for attenuating incident electromagnetic signals;
- wherein the PCB includes at least an upper layer and a lower layer, with the lower layer having edges that are recessed from edges of the upper layer such that the edges of the upper layer respectively protrude and overhang the edges of the lower layer;
- wherein the shaped electrically conductive member and the sidewall means of the apparatus completely enclose at least a top surface of the upper layer and sidewalls disposed at edges of the upper and lower layers of the PCB;

wherein at least a portion of the sidewall means includes at least one of a plurality of first snap-fit latching means for engaging a respective one of a plurality of complementary second snap-fit latching means disposed at one or more of the plurality of edges of the upper and lower layers of the PCB, wherein the plurality of complementary second snap-fit latching means are the protruding edges of the upper layer and the sidewalls of the edges of the lower layer of the PCB; wherein the plurality of first snap-fit latching features are to engage the respective sidewalls of the edges of the lower layer of the PCB underneath the overhang edges of the upper layer of the PCB.

9. The apparatus of claim 8, wherein the shaped EMI shielding means and at least a portion of the sidewall EMI shielding means comprise a unitary construction.

10. The apparatus of claim 8, wherein adjacent portions of the sidewall EMI shielding means are separated by a gap.

11. The apparatus of claim 8, wherein each one of the plurality of first snap-fit latching means is distal to the substantially planar member portion.

12. The apparatus of claim 8, wherein each one of the plurality of first snap-fit latching means is disposed within a medial portion of the sidewall EMI shielding means.

13. The apparatus of claim 8, wherein the at least one of a plurality of first snap-fit latching means and the respective one of a plurality of complementary second snap-fit latching means together form a cantilever latching mechanism.

14. The apparatus of claim 8, further comprising the printed circuit board (PCB) wherein at least one of the upper or lower layer comprises:
- electrically insulative substrate means having a substantially planar substrate surface for mounting thereon a plurality of electronic circuit components; and
- internal electrical conductor means for conducting electrical signals among the plurality of electronic circuit components, and disposed within at least a portion of the electrically insulative substrate means.

15. A method for providing an electromagnetic interference (EMI) shield for removable engagement with a printed circuit board (PCB), comprising:
- forming a shaped electrically conductive member having a substantially planar member portion with a plurality of lateral member edges;
- forming a plurality of sidewalls disposed at respective ones of the plurality of lateral member edges and substantially orthogonal to the substantially planar member portion; and
- forming, within each of at least a portion of the plurality of sidewalls, at least one of a plurality of first snap-fit latching features to engage a respective one of a plurality of complementary second snap-fit latching features disposed at one or more of a plurality of edges of an upper layer and a lower layer of the PCB;
- wherein the PCB includes at least the upper layer and the lower layer, with the lower layer having its edges recessed from the edges of the upper layer such that the edges of the upper layer respectively protrude and overhang the edges of the lower layer;
- wherein the shaped electrically conductive member and the plurality of sidewalls of the EMI shield completely enclose at least a top surface of the upper layer and sidewalls disposed at the edges of the upper and lower layers of the PCB;
- wherein the plurality of complementary second snap-fit latching features are the protruding edges of the upper layer of the PCB and the sidewalls of the edges of the lower layer of the PCB, the upper layer having a thickness that is less than a thickness of the lower layer;
- wherein the plurality of first snap-fit latching features are to engage the respective sidewalls of the edges of the lower layer of the PCB underneath the overhang edges of the upper layer of the PCB.

16. The method of claim 15, wherein the forming a shaped electrically conductive member and forming at least a portion of the plurality of sidewalls of the EMI shield comprise forming a unitary construction.

17. The method of claim 15, wherein adjacent ones of at least a portion of the plurality of sidewalls of the EMI shield are separated by a gap.

18. The method of claim 15, wherein each one of the plurality of first snap-fit latching features is distal to the substantially planar member portion.

19. The method of claim 15, wherein each one of the plurality of first snap-fit latching features is disposed within a medial portion of the sidewall of the EMI shield.

20. The method of claim 15, wherein the at least one of a plurality of first snap-fit latching features and the respective one of a plurality of complementary second snap-fit latching features together form a cantilever latching mechanism.

* * * * *